(12) United States Patent
Sadana et al.

(10) Patent No.: US 10,971,626 B2
(45) Date of Patent: Apr. 6, 2021

(54) INTERFACE CHARGE REDUCTION FOR SIGE SURFACE

(71) Applicant: International Business Machines Corporation, Armonk, NY (US)

(72) Inventors: Devendra Sadana, Pleasantville, NY (US); Dechao Guo, Niskayuna, NY (US); Joel P. de Souza, Putnam Valley, NY (US); Ruqiang Bao, Niskayuna, NY (US); Stephen W. Bedell, Wappingers Falls, NY (US); Shogo Mochizuki, Clifton Park, NY (US); Gen Tsutsui, Glenmont, NY (US); Hemanth Jagannathan, Niskayuna, NY (US); Marinus Hopstaken, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/502,685

(22) Filed: Jul. 3, 2019

(65) Prior Publication Data
US 2019/0326429 A1 Oct. 24, 2019

Related U.S. Application Data

(62) Division of application No. 15/663,133, filed on Jul. 28, 2017, now Pat. No. 10,381,479.

(51) Int. Cl.
*H01L 29/66* (2006.01)
*H01L 21/762* (2006.01)
(Continued)

(52) U.S. Cl.
CPC ........ *H01L 29/785* (2013.01); *H01L 21/0245* (2013.01); *H01L 21/0262* (2013.01);
(Continued)

(58) Field of Classification Search
CPC ..... H01L 29/785; H01L 29/04; H01L 29/161; H01L 21/02123; H01L 29/66545;
(Continued)

(56) References Cited

U.S. PATENT DOCUMENTS

| 5,268,324 A | 12/1993 | Aitken et al. |
| 8,501,629 B2 | 8/2013 | Tang et al. |

(Continued)

OTHER PUBLICATIONS

J.S. Christensen, "Dopant diffusion in Si and SiGe," Ph.D. Thesis, Royal Institute of Technology, Stockholm, Sweden, 2004 (89 pages).
(Continued)

*Primary Examiner* — Cuong B Nguyen
(74) *Attorney, Agent, or Firm* — Randall Bluestone; Michael J. Chang, LLC

(57) ABSTRACT

Techniques for interface charge reduction to improve performance of SiGe channel devices are provided. In one aspect, a method for reducing interface charge density (Dit) for a SiGe channel material includes: contacting the SiGe channel material with an Si-containing chemical precursor under conditions sufficient to form a thin continuous Si layer, e.g., less than 5 monolayers thick on a surface of the SiGe channel material which is optionally contacted with an n-dopant precursor; and depositing a gate dielectric on the SiGe channel material over the thin continuous Si layer, wherein the thin continuous Si layer by itself or in conjunction with n-dopant precursor passivates an interface between the SiGe channel material and the gate dielectric thereby reducing the Dit. A FET device and method for formation thereof are also provided.

16 Claims, 12 Drawing Sheets

(51) Int. Cl.
| | |
|---|---|
| *H01L 29/78* | (2006.01) |
| *H01L 21/02* | (2006.01) |
| *H01L 29/161* | (2006.01) |
| *H01L 29/04* | (2006.01) |
| *H01L 29/10* | (2006.01) |
| *H01L 29/423* | (2006.01) |
| *H01L 29/786* | (2006.01) |
| *H01L 29/51* | (2006.01) |

(52) U.S. Cl.
CPC .. *H01L 21/02123* (2013.01); *H01L 21/02304* (2013.01); *H01L 21/02516* (2013.01); *H01L 21/02532* (2013.01); *H01L 21/762* (2013.01); *H01L 29/04* (2013.01); *H01L 29/1054* (2013.01); *H01L 29/161* (2013.01); *H01L 29/42392* (2013.01); *H01L 29/6656* (2013.01); *H01L 29/66545* (2013.01); *H01L 29/66666* (2013.01); *H01L 29/66795* (2013.01); *H01L 29/7853* (2013.01); *H01L 29/78696* (2013.01); *H01L 29/045* (2013.01); *H01L 29/517* (2013.01); *H01L 29/66628* (2013.01)

(58) Field of Classification Search
CPC ........... H01L 29/6656; H01L 29/66666; H01L 21/762; H01L 29/7378; H01L 31/035254; H01L 31/0745; H01L 29/66431; H01L 21/02381; H01L 21/0245; H01L 21/02532; H01L 31/03687; H01L 31/03765

See application file for complete search history.

(56) References Cited

U.S. PATENT DOCUMENTS 9,607,920 B2    3/2017  Edmonds et al.
2010/0109044 A1  5/2010  Tekleab et al.
2011/0018065 A1  1/2011  Curatola et al.
2014/0159165 A1* 6/2014  van Dal ............. H01L 21/3247
                                                257/401
2014/0264488 A1* 9/2014  Fronheiser .......... H01L 29/785
                                                257/288
2015/0303058 A1  10/2015 Kummel et al.
2016/0190286 A1  6/2016  Wang et al.
2016/0359043 A1* 12/2016 Chen ................. H01L 29/66795
2017/0040159 A1  2/2017  Kachian et al.
2017/0117359 A1  4/2017  Cheng et al.
2017/0133486 A1* 5/2017  Zhou ................. H01L 21/82384

OTHER PUBLICATIONS

K. Sardashti et al., "Sulfur passivation for the formation of Si-terminated Al2O3/SiGe (001) interfaces." Applied Surface Science, vol. 366, Jan. 2016, pp. 455-463.

H. Mertens et al., "Si-cap-free SiGe p-channel FinFETs and gate-all-around transistors in a replacement metal gate process: Interface trap density reduction and performance improvement by high-pressure deuterium anneal," Symposium on VLSI Technology, Jun. 2015, pp. T142-T143.

Y-J. Song et al., "Effects of Si-cap layer thinning and Ge segregation on the characteristics of Si/SiGe/Si heterostructure pMOSFETs," Solid-State Electronics, vol. 46, No. 11, Nov. 2002, pp. 1983-1989 (Abstract, 2 pages).

W-T. Chang et al., "Performance Dependence on Width-to-Length Ratio of Si Cap/SiGe Channel MOSFETs," IEEE Transactions on Electron Devices, vol. 60, No. 11, Nov. 2013, pp. 3663-3668.

S.L. Heslop et al., "Surface Cleaning of SiGe (100) and Passivation of Ge (100) with Aqueous Ammonium Sulfide," ECS Transactions, vol. 69, No. 8, Oct. 2015, pp. 287-293.

List of IBM Patents or Applications Treated as Related (2 pages).

* cited by examiner

INTERFACE CHARGE REDUCTION FOR SIGE SURFACE

CROSS-REFERENCE TO RELATED APPLICATIONS

This application is a divisional of U.S. application Ser. No. 15/663,133 filed on Jul. 28, 2017, now U.S. Pat. No. 10,381,479, the contents of which are incorporated by reference herein.

FIELD OF THE INVENTION

The present invention relates to silicon germanium (SiGe) channel-based devices, and more particularly, to techniques for interface charge reduction to improve performance of SiGe channel-based devices.

BACKGROUND OF THE INVENTION

The implementation of a silicon germanium (SiGe) channel has some notable advantages over a traditional silicon (Si) channel. For instance, a SiGe channel provides a desirable threshold voltage (pVt) without the need for band edge workfunction metal. A SiGe channel also has improved negative-bias temperature instability (NBTI) as compared to Si, which allows for further inversion-layer thickness (Tinv) scaling. A SiGe channel also has higher hole mobility as compared to Si. All of these factors lead to performance improvements over a typical Si-based channel.

However, a notable performance challenge is that the interface charge density (Dit) at the gate dielectric can be more than an order of magnitude greater for a SiGe channel as compared to Si. For instance, Dit on Si is typically in the $1 \times 10^{10}$ $cm^2$ range, whereas Dit can be in the range of $1 \times 10^{11}$ $cm^2$ to $1 \times 10^{12}$ $cm^2$ for SiGe.

Therefore, techniques for reducing Dit for a SiGe channel (e.g., to the $1 \times 10^{10}$ $cm^2$ range) would be desirable.

SUMMARY OF THE INVENTION

The present invention provides techniques for interface charge reduction to improve performance of silicon germanium (SiGe) channel-based devices. In one aspect of the invention, a method for reducing interface charge density (Dit) for a SiGe channel material is provided. The method includes the steps of: contacting the SiGe channel material with a silicon (Si)-containing chemical precursor under conditions sufficient to form a thin continuous Si layer (e.g., less than 5 monolayers thick) on a surface of the SiGe channel material; and depositing a gate dielectric on the SiGe channel material over the thin continuous Si layer, wherein the thin continuous Si layer passivates an interface between the SiGe channel material and the gate dielectric thereby reducing the Dit. The SiGe channel material can also be contacted with an n-dopant precursor under conditions sufficient to chemically dope a surface of the SiGe channel material with an n-type dopant.

In another aspect of the invention, a method of forming a field effect transistor (FET) device is provided. The method includes the steps of: epitaxially growing a SiGe channel material on a substrate; contacting the SiGe channel material with an Si-containing chemical precursor under conditions sufficient to form a thin continuous Si layer (e.g., less than 5 monolayers thick) on a surface of the SiGe channel material; forming a gate stack on the SiGe channel material, wherein the gate stack includes a gate dielectric on the SiGe channel material over the thin continuous Si layer and a gate conductor on the gate dielectric, and wherein the thin continuous Si layer passivates an interface between the SiGe channel material and the gate dielectric. The SiGe channel material can also be contacted with an n-dopant precursor under conditions sufficient to chemically dope a surface of the SiGe channel material with an n-type dopant.

In yet another aspect of the invention, a FET device is provided. The FET device includes: a substrate; an epitaxial SiGe channel material disposed on the substrate; a thin continuous Si layer (e.g., less than 5 monolayers thick) formed on a surface of the SiGe channel material; and a gate stack disposed on the SiGe channel material, wherein the gate stack includes a gate dielectric disposed on the SiGe channel material over the thin continuous Si layer and a gate conductor on the gate dielectric, and wherein the thin continuous Si layer passivates an interface between the SiGe channel material and the gate dielectric. A surface of the SiGe channel material can include a chemically doped n-type dopant selected from the group consisting of: phosphorous, arsenic, bismuth, and combinations thereof.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for reducing interface charge density (Dit) at the gate dielectric for silicon germanium (SiGe) channel-based devices. As will be described in detail below, the present techniques involve, prior to placing the gate dielectric, exposing the surface(s) of the SiGe channel to a silicon (Si)-containing chemical precursor (such as dichlorosilane $SiH_2Cl_2$ (DCS)) to grow a nominally continuous thin Si (e.g., less than 5 monolayers thick) on the SiGe to passivate the SiGe/gate dielectric interface and significantly reduce the Dit. Prior to exposure to the Si-containing chemical precursor, the SiGe channel can be exposed to an n-dopant precursor (such as phosphine) of a variable concentration to dope the SiGe with an n-type dopant. Advantageously, all of these processes can be performed in-situ following (epitaxial) growth of the SiGe, and can be easily integrated into different device process flows. When reference is made herein to 'monolayer' or 'monolayers' this describes a layer or combination of layers each of which is one atom thick, e.g., a single monolayer has a thickness of from about 0.2 nanometers (nm) to about 0.5 nm, and ranges therebetween. Thus, by way of example only, when it is provided herein that the Si layer formed on the SiGe channel is less than 5 monolayers thick the Si layer can include anywhere from a single monolayer to 4 monolayers of Si, and ranges therebetween.

Figure 1:
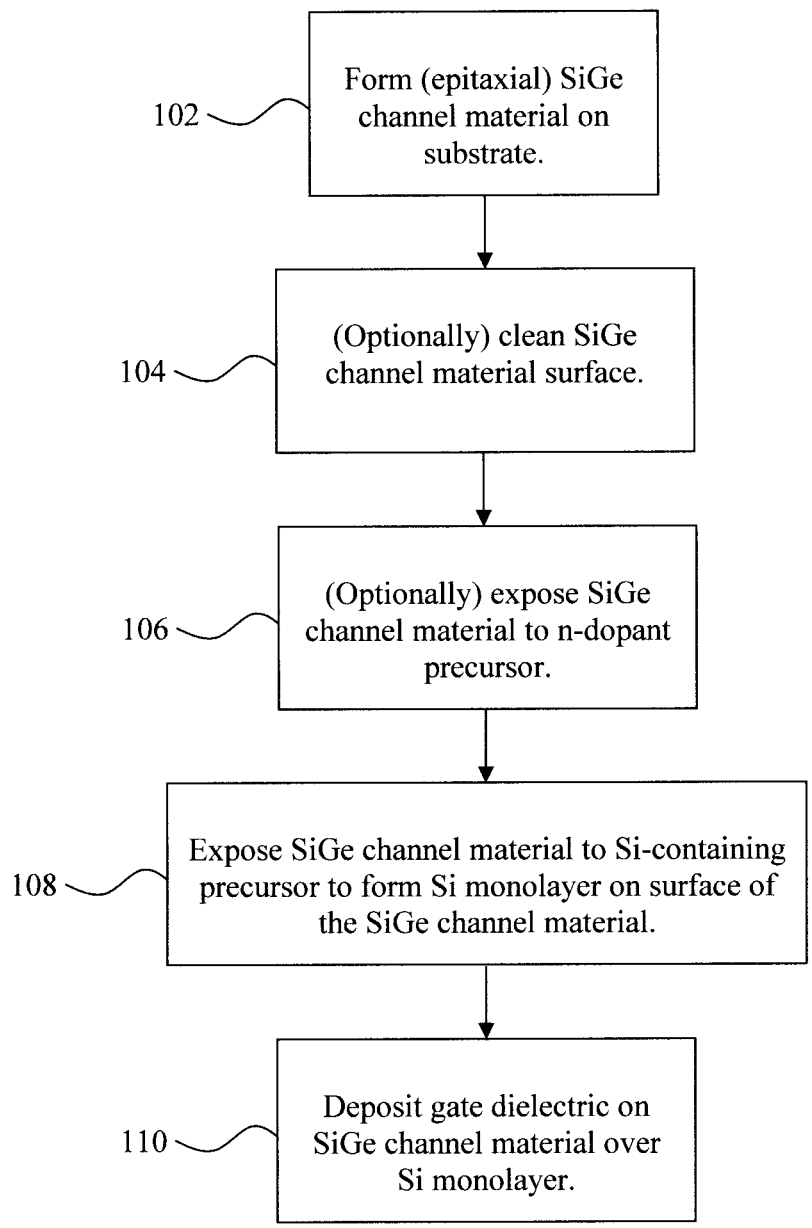
FIG. 1 is a diagram illustrating an exemplary methodology for reducing interface charge density (Dit) for a silicon germanium (SiGe) channel according to an embodiment of the present invention.

An overview of the present techniques is now provided by way of reference to methodology 100 of FIG. 1. In step 102, SiGe is formed on a substrate. According to an exemplary embodiment, the substrate is a crystalline semiconductor such as crystalline Si, SiGe, a III-V material, and/or a II-VI material, having exposed crystallographic surface orientations such as (100), (110), (111), and/or (211) surfaces on which the SiGe is formed.

The term "III-V material" as used herein refers to a material that includes at least one group III element and at least one group V element. By way of example only, suitable III-V materials include, but are not limited to, aluminum gallium arsenide (AlGaAs), aluminum gallium nitride (AlGaN), aluminum indium arsenide (AlInAs), aluminum nitride (AlN), gallium antimonide (GaSb), gallium arsenide (GaAs), gallium nitride (GaN), indium antimonide (InSb), indium arsenide (InAs), indium gallium arsenide (InGaAs), indium gallium nitride (InGaN), indium nitride (InN), indium phosphide (InP), indium gallium arsenide phosphide (InGaAsP), and combinations thereof.

The term "II-VI material" as used herein refers to a material that includes at least one group II element and at least one group VI element. By way of example only, suitable II-VI materials include, but are not limited to, cadmium sulfide (CdS), cadmium selenide (CdSe), cadmium telluride (CdTe), zinc sulfide (ZnS), zinc selenide (ZnSe), zinc telluride (ZnTe), and combinations thereof.

The substrate can be a bulk semiconductor (i.e., bulk Si, III-V and/or II-VI) wafer or a semiconductor-on-insulator (SOI) wafer. A SOI wafer generally includes an SOI layer separated from a substrate by a buried insulator. When the buried insulator is an oxide it is referred to as a "buried oxide" or "BOX." The SOI layer can include any of the above-mentioned semiconductors, i.e., Si, SiGe, III-V and/or II-VI. Thus, for example, if the SOI layer is Si it is a silicon-on-insulator wafer, if the SOI layer is SiGe it is a silicon germanium-on-insulator wafer, and so on. As will be described in detail below, the substrate can be planar (for a planar field effect transistor (FET) device) or, optionally, the substrate can be patterned with three-dimensional features such as fins (for a finFET device), nanosheets/nanowires, etc.

According to an exemplary embodiment, in step 102 the SiGe is epitaxially grown on the substrate. Several exemplary device configurations will be described in detail below where the SiGe formed in step 102 serves as the channel material for a field effect transistor or FET device. To do so, it is preferable to form/grow the epitaxial SiGe to a thickness of from about 10 nm to about 5 micrometers (μm) and ranges therebetween. According to an exemplary embodiment, the SiGe formed in step 102 contains from about 15% to about 40% germanium (Ge) and ranges therebetween, such as from about 15% to about 25% Ge and ranges therebetween.

Optionally, in step 104 the SiGe surface is cleaned to remove surface contaminants (such as native oxides, organic contaminants, etc.) prior to exposure to the n-dopant and/or Si-containing chemical precursors (see steps 106 and 108 described below). For instance, a surface clean might be beneficial when there are intervening steps between when the SiGe is grown and when the n-dopant/Si-containing chemical precursor exposures are performed. See, for example, the exemplary process flows below where a gate-last approach is implemented, and the exposures occur after removal of the dummy gate. On the other hand, if the SiGe epitaxy and the exposures are performed in-situ (i.e., in the same apparatus (e.g., epitaxial reactor) without breaking vacuum in between the steps), then an intervening surface clean might be foregone.

By way of example only, the surface cleaning performed in step 104 can include a SiCoNi™ process with or without a surface treatment with hydrofluoric acid (HF) (removes native oxides) or standard RCA clean (removes organic contaminants). SiCoNi™ is a dry etching process whereby a substrate is exposed to $H_2$, $NF_3$ and $NH_3$ plasmas. See, for example, U.S. Pat. No. 8,501,629 issued to Tang et al., entitled "Smooth SiCono Etch for Silicon-Containing Films," the contents of which are incorporated by reference as if fully set forth herein.

In step 106, the SiGe is exposed to an n-type dopant (or simply "n-dopant") precursor. This step is optional, since exposure to the Si-containing chemical precursor (see step 108) can be performed independently, if so desired, to reduce the Dit. According to an exemplary embodiment, the n-dopant precursor contains at least one group V element, such as phosphorous (P), arsenic (As), and/or bismuth (Bi), and is in a solid, liquid or gaseous form. By way of example only, suitable phosphorous-containing liquid precursors include, but are not limited to, tributyl phosphate (TBP), suitable phosphorous-containing gaseous precursors include, but are not limited to, phosphine ($PH_3$), and suitable phosphorus-containing solid source include, but are not limited to, elemental red phosphorus. Suitable arsenic-containing gaseous precursors include, but are not limited to, arsine and tertiarybutylarsine (TBA). Suitable bismuth-containing liquid precursor includes, but is not limited to, bismuth(III) 2-ethylhexanoate.

The concentration of the n-dopant precursor is configured to achieve a desired n-dopant surface concentration on the SiGe channel material. The concentration of the n-dopant precursor can be varied by diluting the n-dopant precursor, e.g., with a non-reactive carrier gas such as hydrogen ($H_2$). According to an exemplary embodiment, a desired n-dopant surface concentration is greater than or equal to $1 \times 10^{16}$ $cm^{-3}$, e.g., from about $1 \times 10^{19}$ $cm^{-3}$, to about $3 \times 10^{21}$ $cm^{-3}$ and ranges therebetween. When reference is made herein to a "surface" of the SiGe channel material this describes a portion of the SiGe extending inward a depth of from about 1 nm to about 10 nm and ranges therebetween from the outer surfaces of the SiGe.

According to an exemplary embodiment, step 106 is carried out by contacting the SiGe channel material with the dopant precursor under conditions sufficient to chemically dope the surface of the SiGe channel material with the n-type dopant. By way of example only, the conditions include a temperature of from about 400 degrees Celsius (° C.) to about 700° C. and ranges therebetween, a pressure of from about 1 torr to about 100 torr and ranges therebetween, and a duration of from about 1 second to about 100 seconds and ranges therebetween. As described above, the SiGe epitaxy, the dopant precursor exposure and/or the Si-containing chemical precursor exposure (see below) can be performed in-situ in the same reaction vessel (e.g., epitaxial reactor).

In step 108, the SiGe channel material (optionally doped with an n-type dopant in step 106) is then exposed to a Si-containing chemical precursor so as to form a thin continuous Si layer on the SiGe channel material. According to an exemplary embodiment, the Si layer formed in step 108 is less than 5 monolayers thick, e.g., from about one monolayer to about 3 monolayers thick and ranges therebetween. Suitable Si-containing chemical precursors include, but are not limited to, silicon-hydrogen (Si—H) molecules with or without chlorine (Cl), such as silane ($SiH_4$), disilane ($Si_2H_6$), dichlorosilane ($Si_2H_2Cl_2$ or DCS), etc. The Si-containing chemical precursor can be in a solid, liquid or gaseous form.

According to an exemplary embodiment, step 108 is carried out by contacting the SiGe channel material with the Si-containing chemical precursor under conditions sufficient to form a thin continuous Si layer less than 5 monolayers thick on the SiGe channel material. By way of example only, the conditions include a temperature of from about 400° C. to about 800° C. and ranges therebetween, a pressure of from about 1 torr to about 100 torr and ranges therebetween, and a duration of from about 1 second to about 100 seconds and ranges therebetween. Preferably, a temperature ramp up of, e.g., from about 2° C./second to about 4° C./second and ranges therebetween, is employed. As described above, the SiGe epitaxy, the dopant precursor exposure and/or the Si-containing chemical precursor exposure (see below) can be performed in-situ in the same reaction vessel (e.g., epitaxial reactor).

It has been discovered that formation of a continuous Si layer less than a few monolayers thick is difficult using a low-temperature (less than 600° C.) silane-based growth process. Although transmission electron microscopy images suggest a continuous layer, chemical tests reveal the existence of pinholes in the Si layer and capacitance-voltage measurements of devices made thereupon show elevated Dit. The use of higher temperature (greater than 600° C.) and dichlorosilane (DCS) to form a continuous Si layer less than a few monolayers thick was shown to reduce substantially or eliminate the pinholes observed during chemical tests and Dit was also reduced compared to the lower temperature silane-based growth. The exact reason for this ability to form extremely thin continuous (pinhole-free) Si layers is unknown but may be related to improved step-flow coverage using the higher temperature DCS-based growth.

Next, in step 110 a gate dielectric is deposited onto the SiGe channel material over the thin continuous Si layer. As will be described in detail below, depending on the particular process flow being implemented there may be intervening steps between the dopant/Si precursor exposures and deposition of the gate dielectric and/or additional steps performed before or after the gate dielectric is in place. The only requirement is that the exposures are performed prior to the gate dielectric deposition in order to passivate the SiGe/gate dielectric interface and reduce the Dit.

The above-described techniques can be implemented in a number of different process flows, a few illustrative, non-limiting examples of which are now described. In a first exemplary embodiment, methodology 100 is integrated into a finFET process flow with SiGe fin channels. As is generally known in the art, a FET includes a source region and a drain region interconnected by a channel region. A gate(s) regulates current flow through the channel region. In a finFET, the channel region includes one or more fins.

In the embodiments that immediately follow, a gate-last approach is described. In general, with a gate-last approach a sacrificial or "dummy" gate is placed over the channel region early in the process. This enables the placement of the source and drain regions, after which the dummy gate is removed and replaced with a "replacement" gate stack. An advantage to the gate-last approach is that the replacement gate stack is formed at the end of the process, thereby limiting exposure of the gate stack to potentially damaging conditions during device fabrication, such as elevated temperatures which can damage the gate stack components. Particularly susceptible are the high-κ gate dielectrics employed with metal gate stacks. The term "high-κ" as used herein refers to a material having a relative dielectric constant κ which is much higher than that of silicon dioxide ($SiO_2$) (e.g., a dielectric constant κ=25 for hafnium oxide ($HfO_2$) rather than 4 for $SiO_2$). Thus, damage can be avoided by placing the replacement gate at the end of the process.

When the gate conductor is a metal(s), the gate-last approach is also referred to herein as a "replacement metal gate" or "RMG" process. Embodiments are also anticipated herein where a gate-first approach is employed. As its name implies, a gate-first approach places the device gate stack at the beginning of the process, rather than a dummy gate. Doped poly-silicon (poly-Si) or doped poly-Si/metal gate conductors are suited for a gate first approach.

Figure 2:
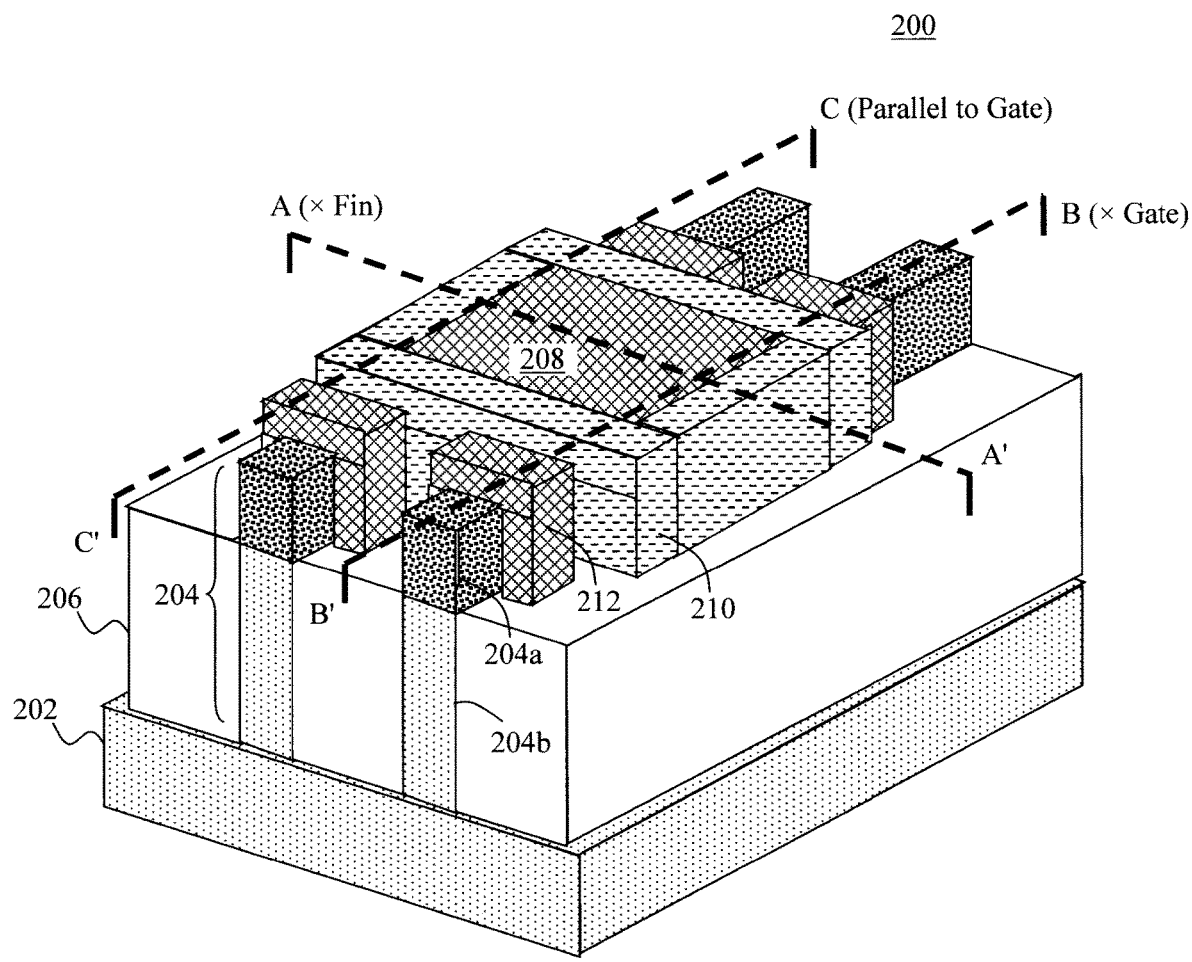
FIG. 2 is a three-dimensional diagram of an exemplary fin field effect transistor (finFET) device formed using the present techniques according to an embodiment of the present invention.

FIG. 2 is a three-dimensional diagram of an exemplary finFET device 200 that can be formed using the present techniques. As shown in FIG. 2, finFET device 200 includes a substrate 202 and at least one fin 204 formed on the substrate 202. In this example, multiple fins 204 are present. As will be described in detail below, the fins 204 can be formed by (epitaxially) growing a SiGe channel material on the substrate 202, and then patterning the SiGe channel material and a portion of the underlying substrate 202 into the fins 204. Thus, as shown in FIG. 2, each of the fins 204 has a top portion 204a that is composed of the SiGe channel material and a bottom portion 204b that is the substrate material, e.g., Si, SiGe, a III-V material, a II-VI material, etc. (see above). Isolation of the fins 204 is achieved via a shallow trench isolation or STI oxide 206 surrounding the bottom portion 204b of each of the fins 204.

A gate 208 is present over a portion of each of the fins 204 that serve as the channel region of finFET device 200. By way of example only, in a RMG process, gate 208 is representative of the replacement metal gate. Portions of the fins 204 extending out from under the gate serve as source and drain regions of finFET device 200. The gate 208 is offset from the source and drain regions by spacers 210 which are present on opposite sides of the gate 208. Source/drain contacts 212 are formed to the source and drain regions on opposite sides of the gate 208.

The description below, and accompanying figures, will reference various cross-sectional views through finFET device 200. For instance, a view A along A-A' illustrates a cross-section through the gate 208 and fins 204 perpendicular to the fins, i.e., fin cross-section or (× Fin). A view B along B-B' illustrates a cross-section through the gate 208 and fins 204 parallel to the fins, i.e., gate cross-section or (× Gate). A view C along C-C' illustrates a cross-section through the gate 208 parallel to the gate 208 and fins 204 (Parallel to Gate).

Figure 3:
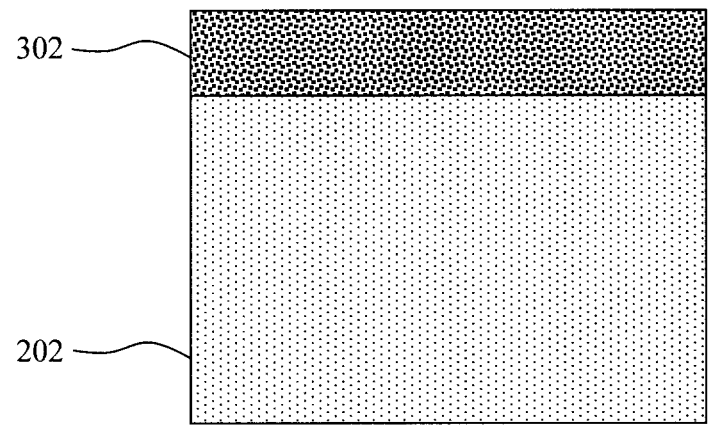
FIG. 3 is a cross-sectional diagram illustrating, to begin fabrication of the finFET device of FIG. 2, an epitaxial SiGe channel material having been grown on a substrate according to an embodiment of the present invention.

As shown in FIG. 3, to begin fabrication of finFET device 200 an epitaxial SiGe channel material 302 is grown on the substrate 202. Suitable substrate materials were provided above. According to an exemplary embodiment, the SiGe channel material 302 is grown to a thickness of from about 10 nm to about 5 μm and ranges therebetween, and contains from about 15% to about 40% Ge and ranges therebetween, such as from about 15% to about 25% Ge and ranges therebetween. FIG. 3 generally represents any of the cross-sections A, B and C.

Figure 4:
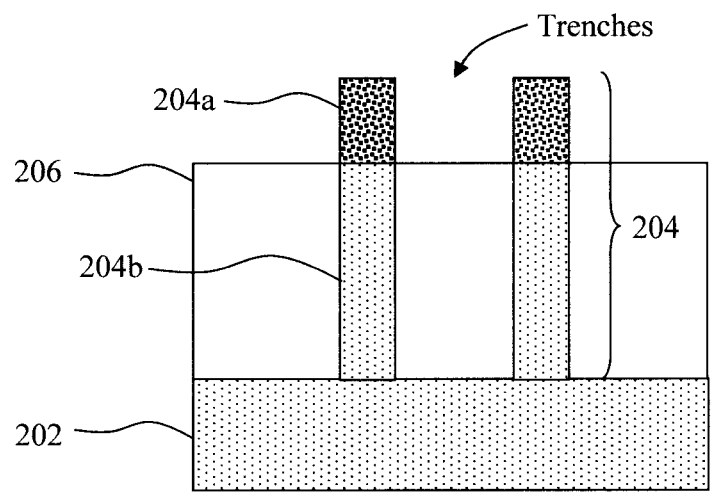
FIG. 4 is a cross-sectional diagram illustrating the SiGe (and a portion of the substrate) having been patterned into one or more fins according to an embodiment of the present invention.

The SiGe channel material 302 (and a portion of the substrate 202) are then patterned into one or more individual fins 204 using a standard lithography and etching process. See FIG. 4 (representative of cross-section A). In the example shown illustrated in FIG. 4, the fin formation involves patterning one or more trenches in the SiGe channel material 302/substrate 202 that extend completely through the SiGe channel material 302 and partway through the substrate 202. Thus, each patterned fin 204 has a top (SiGe channel material) portion 204a and a bottom (substrate) portion 204b. STI oxide 206 is then placed into the trenches surrounding the bottom portion 204b of the fins 204.

In this particular example, a dummy gate will be implemented prior to the dopant and/or Si monolayer precursor exposures. This is merely one option, however, and examples will be provided below wherein the exposures occur prior to the placement of the dummy gate.

Figure 5:
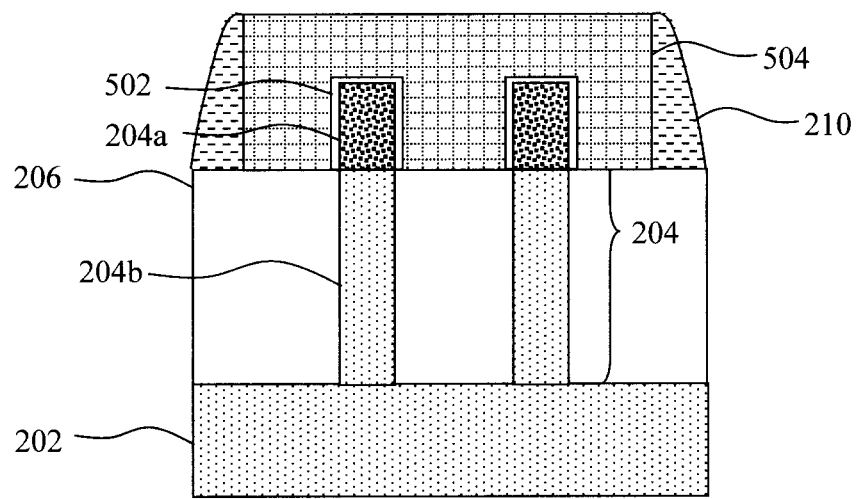
FIG. 5 is a cross-sectional diagram illustrating at least one dummy gate having been formed over the fins in a channel region of the finFET device according to an embodiment of the present invention.

To begin the RMG process, a dummy gate oxide 502 is placed on the fins 204, followed by a dummy gate material. Standard lithography and etching procedures are then used to pattern the dummy gate material into at least one dummy gate 504 over the channel region of the finFET device 200. See FIG. 5 (representative of cross-section A). Suitable dummy gate materials include, but are not limited to, amorphous-Si, poly-Si, etc. Spacers 210 are placed on opposite sides of dummy gate 504. Spacers 210 offset the dummy gate 504 from the source and drain regions 212 (visible in FIG. 2 and in later figures) which are also formed at this stage in the process on opposite sides of the dummy gate 504. It is notable that while the spacers 210 are depicted generically in FIG. 2 as being square, in practice the spacers 210 will have a rounded upper corner as shown in FIG. 5. Namely, the process used to form the spacers 210 involves depositing a suitable spacer material (such as an oxide or a nitride material) and then using an etch to pattern the spacer material into the individual spacers 210. As a result, the exposed corners of the spacers will be rounded by the etching.

Figure 6:
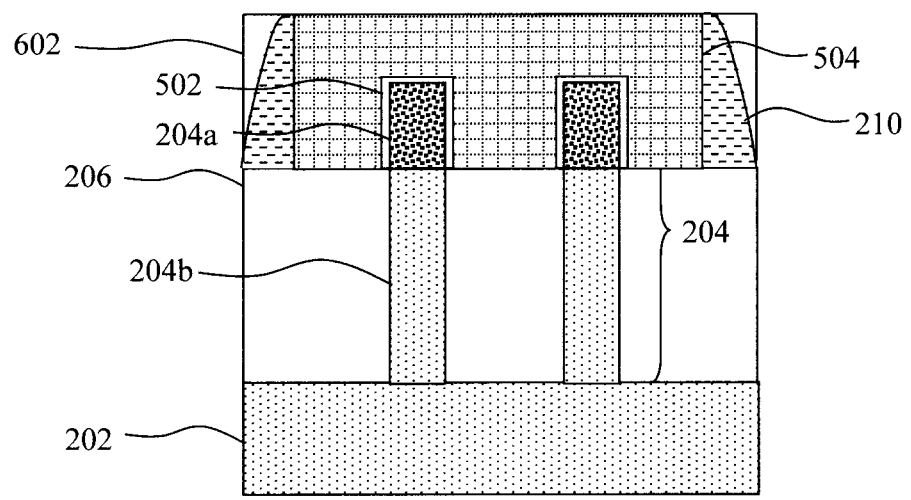
FIG. 6 is a cross-sectional diagram illustrating a dielectric material having been deposited around the dummy gate according to an embodiment of the present invention.
Figure 7:
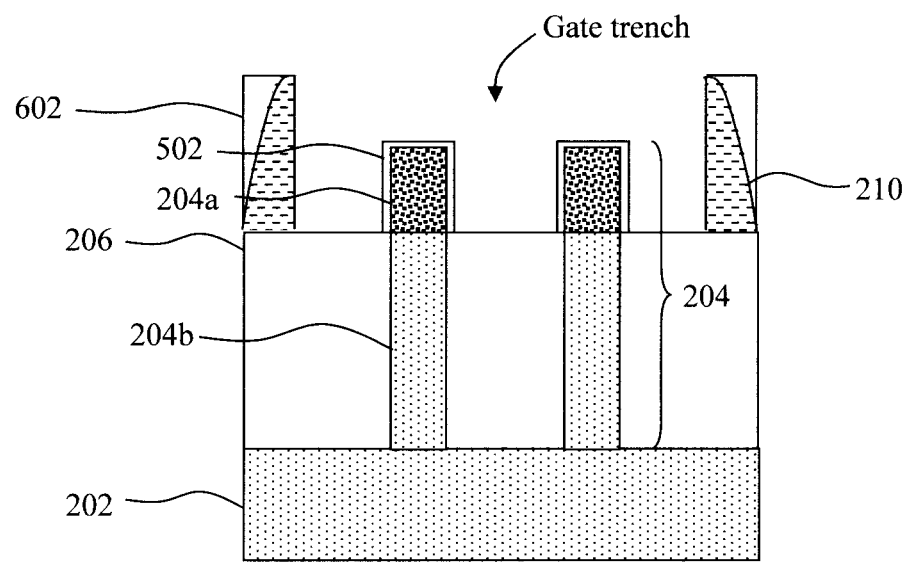
FIG. 7 is a cross-sectional diagram illustrating the dummy gate having been removed selective to the dielectric material forming a gate trench in the dielectric material according to an embodiment of the present invention.

As provided above, the dummy gate 504 serves as a placeholder for a replacement gate over the channel region. In order to enable selective removal of the dummy gate 504, a dielectric material 602 (e.g., an interlayer dielectric or ILD) can be deposited onto the device, surrounding the dummy gate 504. See FIG. 6 (representative of cross-section A). As shown in FIG. 6, the dielectric material 602 can then be polished to expose a top surface of the dummy gate 504. A selective etch (such as a poly-Si selective reactive ion etching (RIE) for a poly-Si dummy gate) is then used to remove the dummy gate 504 selective to the dielectric material 602 forming a gate trench in the dielectric material 602. See FIG. 7 (representative of cross-section A).

In this particular example, it is at this point in the process where the above-described exposure(s) (see methodology 100 of FIG. 1) are performed. For instance, after removal of the dummy gate 504, an optional etch may be performed in the gate trench to remove the dummy gate oxide 502, if any, remaining on the fins thereby exposing the fins in the channel region of the device. As described in accordance with the description of step 104 of methodology 100 above, a surface of the SiGe channel material now-exposed in the channel region of the device can be cleaned to remove surface contaminants, such as via a SiCoNi™ process with or without a surface treatment with HF or standard RCA clean. See above.

Figure 8:
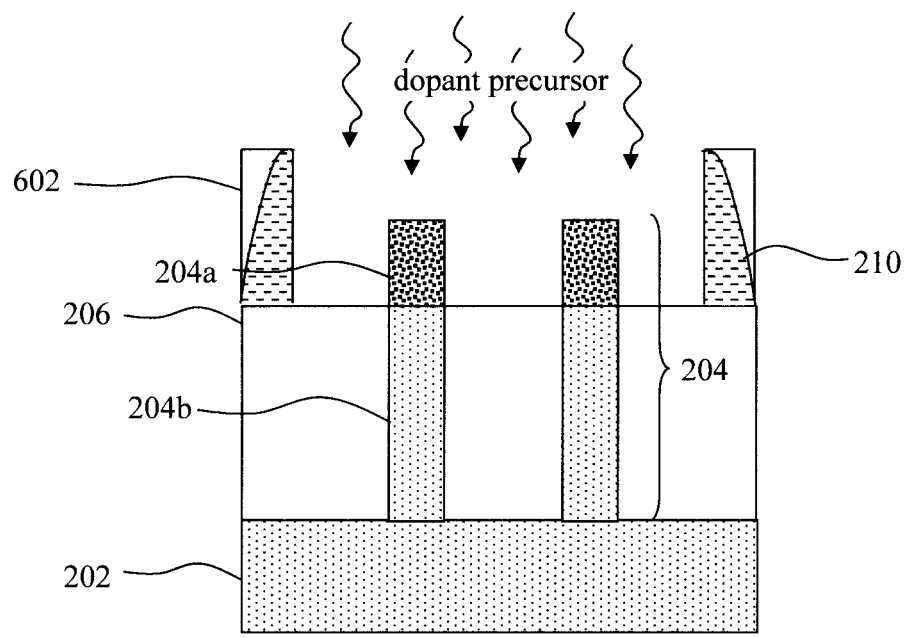
FIG. 8 is a cross-sectional diagram illustrating an (optional) exposure of the SiGe channel to an n-dopant precursor according to an embodiment of the present invention.

Next, an optional exposure of the SiGe channel material to an n-dopant precursor containing, e.g., P, As, and/or Bi, in a solid, liquid or gaseous form can be performed. See FIG. 8 (representative of cross-section A). For instance, as described in accordance with the description of step 106 of methodology 100 above, the SiGe channel material is contacted with the dopant precursor under conditions sufficient to chemically dope the surface of the SiGe channel material with the n-type dopant. Suitable conditions, i.e., temperature, pressure, and duration, were provided above. As also described above, the n-dopant gaseous or liquid precursor can be diluted, e.g., with a non-reactive carrier gas such as $H_2$, in order to achieve a desired n-dopant surface concentration on the SiGe.

Figure 9:
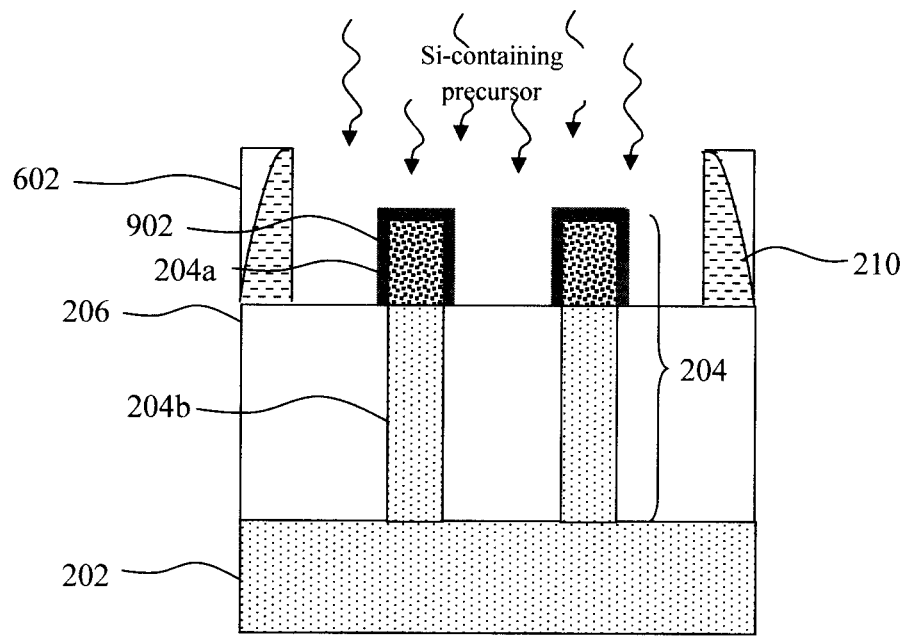
FIG. 9 is a cross-sectional diagram illustrating the SiGe channel material being exposed to an silicon (Si)-containing chemical precursor so as to form a thin continuous Si layer (e.g., less than 5 monolayers thick) on the SiGe channel material according to an embodiment of the present invention.

The SiGe channel material is then exposed to an Si-containing chemical precursor, e.g., Si—H molecules with or without Cl, such as $SiH_4$, $Si_2H_6$, $Si_2H_2Cl_2$ (DCS), in a solid, liquid or gaseous form. See FIG. 9 (representative of cross-section A). For instance, as described in accordance with the description of step 108 of methodology 100 above, the SiGe channel material is contacted with the Si-containing chemical precursor under conditions sufficient to form a thin continuous Si layer 902 less than 5 monolayers thick on the SiGe channel material. Suitable conditions, i.e., temperature, pressure, and duration, were provided above.

Figure 10:
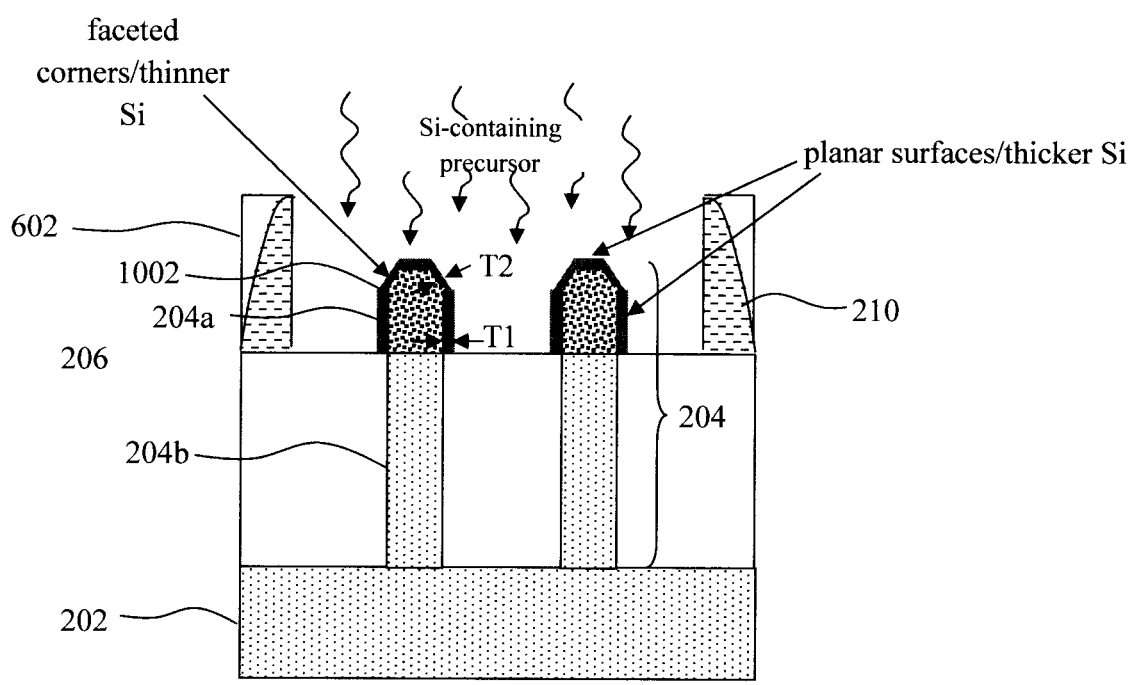
FIG. 10 is a cross-sectional diagram illustrating the SiGe channel material being exposed to an Si-containing chemical precursor so as to form a thin continuous Si layer on the SiGe channel which is thinner at the faceted surfaces as compared to planar surfaces due to a different crystal orientation at the facets, such as <111>, <211>, <311>, <511> according to an embodiment of the present invention.

In one exemplary embodiment, the thin continuous Si layer 902 has a uniform thickness over the surface of the SiGe channel material. See FIG. 9. It is notable however that the fins 204 can in fact become faceted by exposure to the Si and Cl during this process. As a result, a thin continuous Si layer 1002 that is formed can be thinner on the faceted surfaces as compared to the planar surfaces of the SiGe channel material due to a different crystal orientation at the facets, such as <111>, <211>, <311>, <511>. See FIG. 10 (representative of cross-section A). Namely, as shown in FIG. 10, the Si layer 1002 is has a thickness T1 on the top and vertical sidewalls of the SiGe channel material portion 204a of the fins 204 and a thickness T2 at the facets, wherein T1>T2. By way of example only, if T1 is 3 monolayers thick, then T2 can be 2 monolayers thick or even a single monolayer.

Figure 11:
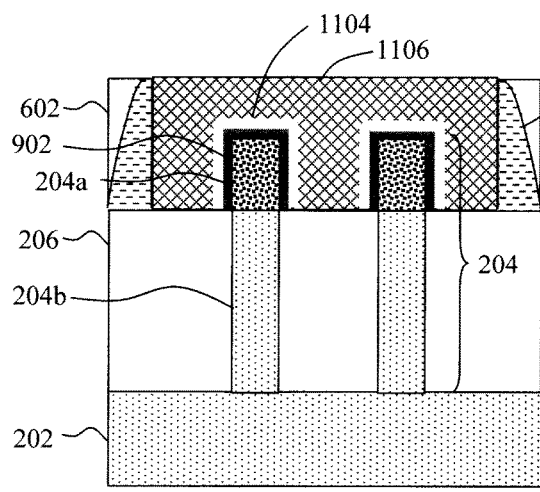
FIG. 11 is a cross-sectional diagram illustrating a replacement gate stack having been formed in the gate trench on the (optionally doped) SiGe channel material over the thin continuous Si layer according to an embodiment of the present invention.
Figure 12:
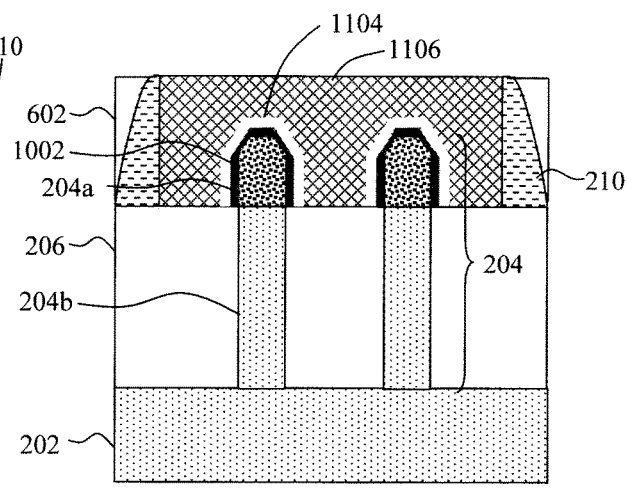
FIG. 12 is a cross-sectional diagram illustrating the replacement gate stack having been formed in the gate trench on the (optionally doped) SiGe channel material over the thin continuous Si layer and faceted surfaces according to an embodiment of the present invention.

Next, a replacement gate stack (representative of gate 208 in FIG. 2) is formed in the gate trench over the SiGe channel material (which is now optionally chemically doped with the n-type dopant and coated with a thin continuous Si layer). See FIG. 11 with a thin continuous Si layer and FIG. 12 with a thin continuous Si layer which is thinner at the facets, both of which are representative of cross-section A. According to an exemplary embodiment, the replacement gate stack is a metal gate, and the instant process is a RMG process. The replacement gate stack includes a gate dielectric 1104 disposed on the SiGe channel material over the Si monolayer, and a metal or combination of metals 1106 disposed on the gate dielectric 1104. The presence of the thin continuous Si layer on the SiGe channel material passivates the SiGe/gate dielectric interface and significantly reduces the Dit. Suitable gate dielectrics for a metal gate include, but are not limited to, high-κ materials such as hafnium oxide ($HfO_2$) and lanthanum oxide ($La_2O_3$). According to an exemplary embodiment, a combination of gate metals is used in the replacement gate. For instance, a workfunction setting metal layer is deposited onto the gate dielectric 1104, followed by a filler metal layer. Suitable workfunction setting metals include, but are not limited to, n-type workfunction setting metals such as titanium nitride (TiN) and tantalum nitride (TaN), and p-type workfunction setting metals such as tungsten (W). Suitable filler metals include, but are not limited to, aluminum (Al).

Figure 13:
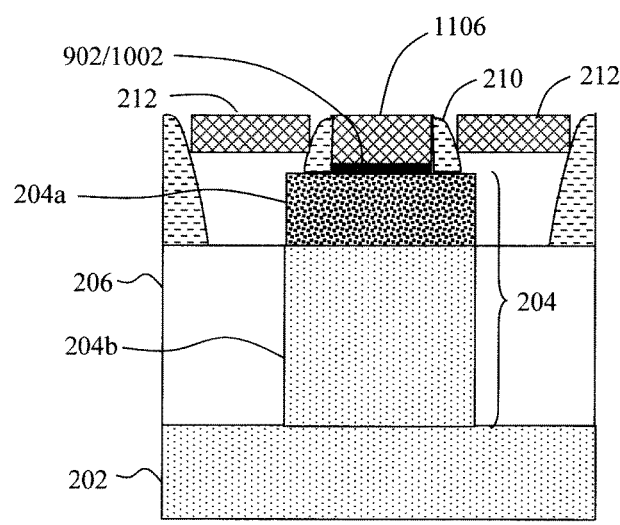
FIG. 13 is another cross-sectional diagram illustrating the replacement gate stack having been formed in the gate trench on the (optionally doped) SiGe channel material over the thin continuous Si layer according to an embodiment of the present invention.

FIG. 13 provides a different cross-sectional view (representative of cross-section B) of the replacement gate 1102. FIG. 13 illustrates the source and drain regions 212 present on opposite sides of the replacement gate stack 1102, offset by the spacers 210. The portion of the thin continuous Si layer visible in this cross-sectional view is representative of either Si layer 902 or 1002.

Figure 14:
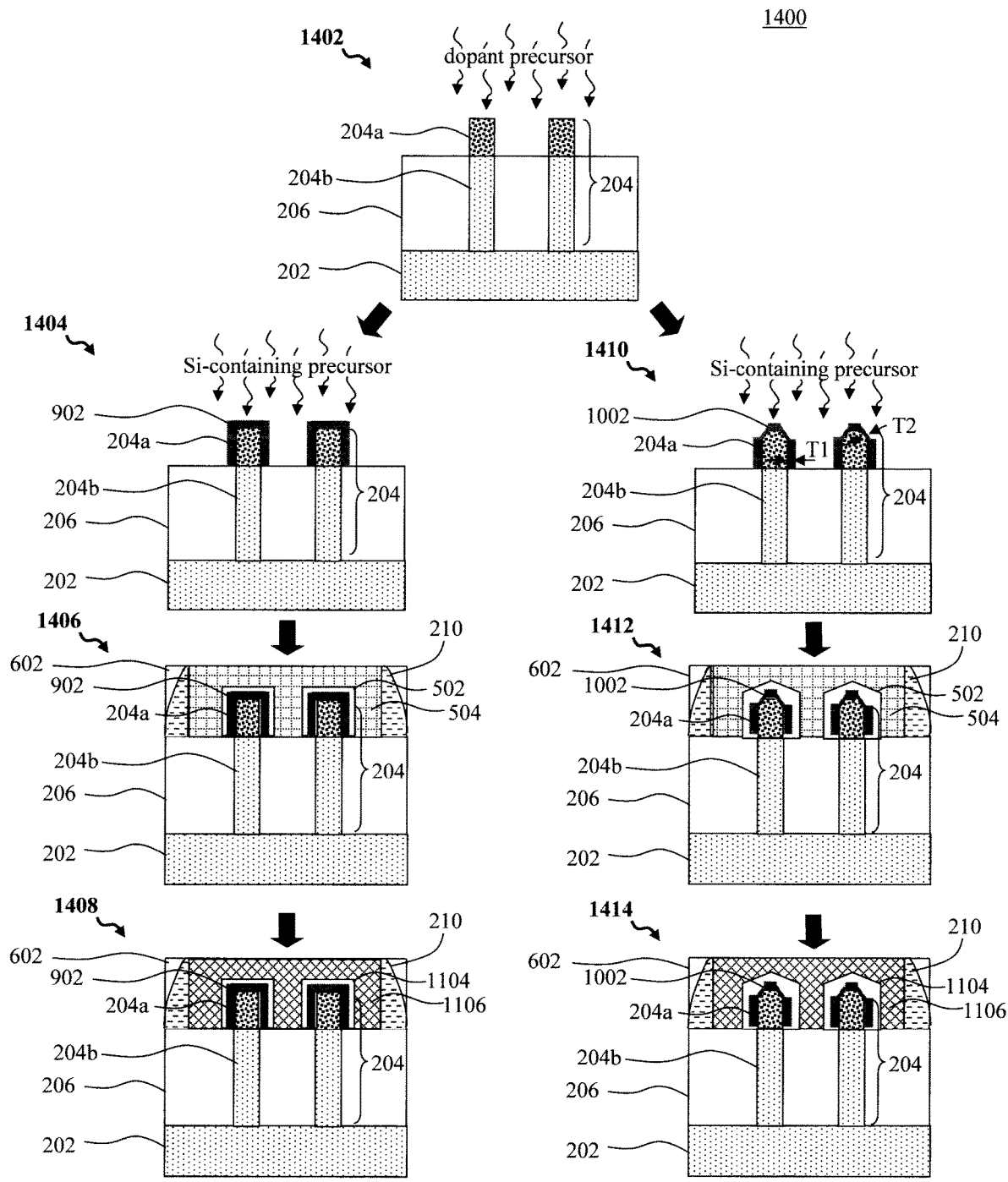
FIG. 14 is a diagram illustrating an alternative exemplary methodology for forming a finFET device according to an embodiment of the present invention.

Optionally, the dopant/Si-containing chemical precursor exposures may be performed earlier on in the process, such as prior to placement of the dummy gate. See, for example, methodology 1400 of FIG. 14 which depicts representative views of cross-section B. The details of the process flow illustrated in FIG. 14 are the same as described above, except that the exposure(s) are performed at a different stage. Thus, like structures are numbered alike in the description that follows.

In the same manner as described above, in step 1402 an epitaxial SiGe channel material is grown on a substrate 202, and the SiGe channel material (and a portion of the substrate 202) are then patterned into one or more individual fins 204 with each patterned fin 204 having a top (SiGe channel material) portion 204a and a bottom (substrate) portion 204b. An STI oxide 206 is placed around the bottom portion 204b of each of the fins 204.

In contrast to the example above, here the dopant/Si precursor exposures are performed immediately after the fins 204 have been formed. Namely, following the fin patterning, the SiGe channel material (i.e., the top SiGe portions 204a of the patterned fins 204) is then optionally exposed to an n-dopant precursor containing, e.g., P, As, and/or Bi, in a solid, liquid or gaseous form. For instance, as described in accordance with the description of step 106 of methodology 100 above, the SiGe channel material is contacted with the dopant precursor under conditions sufficient to chemically dope the surface of the SiGe channel material with the n-type dopant. Suitable conditions, i.e., temperature, pressure, and duration, were provided above. As also described above, the n-dopant precursor can be diluted, e.g., with a non-reactive carrier gas such as $H_2$, in order to achieve a desired n-dopant surface concentration on the SiGe channel material.

In step 1404, the SiGe channel material is then exposed to an Si-containing chemical precursor, e.g., Si—H molecules with or without Cl, such as $SiH_4$, $Si_2H_6$, $Si_2H_2Cl_2$ (DCS), in a solid, liquid or gaseous form. For instance, as described in accordance with the description of step 108 of methodology 100 above, the SiGe channel material is contacted with the Si-containing chemical precursor under conditions sufficient to form a thin continuous Si layer 902 less than 5 monolayers thick on the SiGe channel material. Suitable conditions, i.e., temperature, pressure, and duration, were provided above.

Once the exposures have been performed, the balance of the process remains the same, from placement of the dummy gate oxide 502/dummy gate 504 and spacers 210, and depositing a dielectric material 602 around the dummy gate 504 (see step 1406) to replacing the dummy gate 504 with a replacement gate, e.g., a RMG stack (see step 1408). As shown in step 1408, the replacement gate stack includes a gate dielectric 1104 over the thin continuous Si layer 902. The presence of the thin continuous Si layer 902 on the SiGe channel passivates the SiGe/gate dielectric interface and significantly reduces the Dit.

As described in detail above, the fins 204 can become faceted by exposure to the Si and Cl during the exposure to the Si containing precursor, resulting in a Si layer 1002 that is thinner on the faceted surfaces as compared to the planar surfaces of the SiGe channel material due to a different crystal orientation at the facets, such as <111>, <211>, <311>, <511>. This scenario is depicted in steps 1410-1414 which are counterpart to steps 1404-1408 except that the thin continuous Si layer 1002 has a thickness T1 on the top and vertical sidewalls of the upper SiGe channel material portion 204a of the fins 204 and a thickness T2 at the facets, wherein T1>T2.

The fabrication of a finFET device is only one exemplary implementation of the present techniques. By way of example only, the present techniques may also be employed in conjunction with a planar device process flow. See, for example, methodologies 1500 and 1600 illustrated in FIGS. 15 and 16, respectively.

Figure 15:
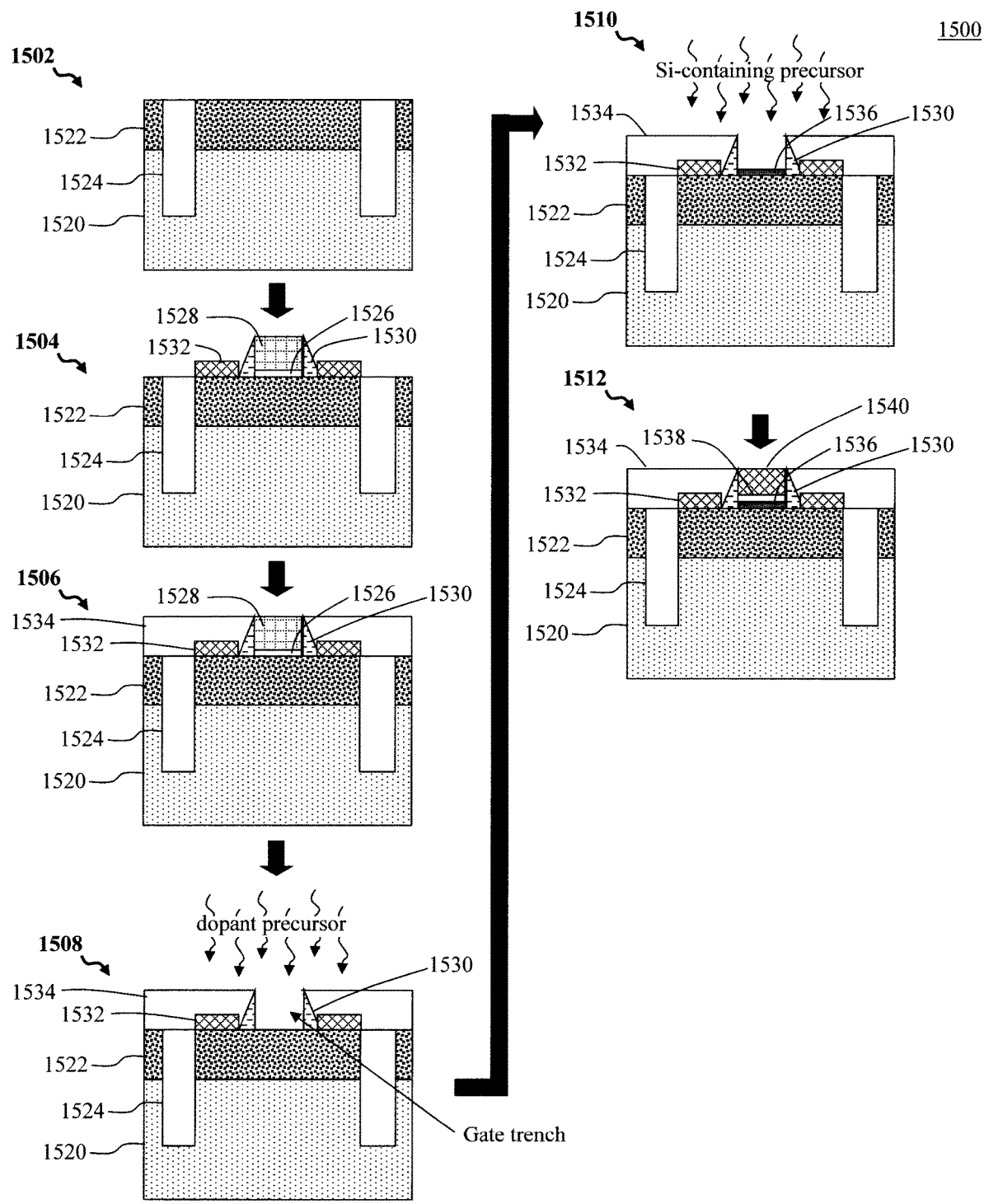
FIG. 15 is a diagram illustrating an exemplary methodology for forming a planar FET device according to an embodiment of the present invention.

In a first exemplary planar FET embodiment shown illustrated in FIG. 15, a RMG process flow is implemented and the dummy gate is placed prior to the dopant/Si precursor exposure(s). The process begins in step 1502 with an epitaxial SiGe channel material 1522 being grown on a substrate 1520. Suitable substrate materials were provided above. According to an exemplary embodiment, the SiGe channel material 1522 is grown to a thickness of from about 10 nm to about 5 µm and ranges therebetween, and contains from about 15% to about 40% Ge and ranges therebetween, such as from about 15% to about 25% Ge and ranges therebetween. STI regions 1524 are then formed extending through the SiGe channel material 1522 and partway through the substrate 1520. The STI regions 1524 serve to define an active area of the device in which SiGe 1522 is the channel material.

To begin the RMG process, a dummy gate oxide 1526 is placed on the SiGe channel material 1522, followed by a dummy gate material. A standard lithography and etching process is then used to pattern the dummy gate material into at least one dummy gate 1528 over a channel region of the FET device. See step 1504. Suitable dummy gate materials include, but are not limited to, amorphous-Si, poly-Si, etc. Spacers 1530 are placed on opposite sides of the dummy gate 1528 and offset the dummy gate 1528 from source and drain regions 1532 which are also formed at this stage in the process on opposite sides of the dummy gate 1528.

As described above, the dummy gate 1528 serves as a placeholder for a replacement gate over the channel region. In order to enable selective removal of the dummy gate 1528, a dielectric material 1534 (e.g., an interlayer dielectric or ILD) is deposited onto the device, covering the dummy gate 1528. See step 1506. The dielectric material 1534 is polished to expose a top surface of the dummy gate 1528, and a selective etch (such as a poly-Si selective RIE for a poly-Si dummy gate) is then used to selectively remove the dummy gate 1528, forming a gate trench in the dielectric material 1534. See step 1508.

In this particular example, it is at this point in the process where the above-described exposure(s) (see methodology 100 of FIG. 1) are performed. For instance, after removal of the dummy gate 1528, an optional etch may be performed in the gate trench to remove the dummy gate oxide 1526, if any, remaining on the SiGe channel material 1522, thereby exposing the channel region of the device. As described in accordance with the description of step 104 of methodology 100 above, the SiGe channel material now-exposed in the channel region of the device can be cleaned to remove surface contaminants, such as via a SiCoNi™ process with or without a surface treatment with HF or standard RCA clean.

Next, an optional exposure of the SiGe channel material to an n-dopant precursor containing, e.g., P, As, and/or Bi, in a solid, liquid or gaseous form can be performed. For instance, as described in accordance with the description of step 106 of methodology 100 above, the SiGe channel material is contacted with the dopant precursor under conditions sufficient to chemically dope the surface of the SiGe channel material with the n-type dopant. Suitable conditions, i.e., temperature, pressure, and duration, were provided above. As also described above, the n-dopant precursor can be diluted, e.g., with a non-reactive carrier gas such as $H_2$, in order to achieve a desired n-dopant surface concentration on the SiGe channel material.

The SiGe channel material is then exposed to an Si-containing chemical precursor, e.g., Si—H molecules with or without Cl, such as $SiH_4$, $Si_2H_6$, $Si_2H_2Cl_2$ (DCS), in a solid, liquid or gaseous form. See step 1510. For instance, as described in accordance with the description of step 108 of methodology 100 above, the SiGe channel is contacted with the Si-containing chemical precursor under conditions sufficient to a thin continuous Si layer 1536 less than 5 monolayers thick on the SiGe channel material within the gate trench. Suitable conditions, i.e., temperature, pressure, and duration, were provided above.

Next, a replacement gate stack is formed in the gate trench over the channel region (which is now optionally chemically doped with the n-type dopant and coated with a thin continuous Si layer 1536). See step 1512. According to an exemplary embodiment, the replacement gate stack is a metal gate, and the instant process is a RMG process. The replacement gate stack includes a gate dielectric 1538 on the SiGe channel over the thin continuous Si layer 1536, and a metal or combination of metals 1540 on the gate dielectric 1538. The presence of the thin continuous Si layer 1536 on the SiGe channel material passivates the SiGe/gate dielectric interface and significantly reduces the Dit. Suitable gate dielectrics for a metal gate include, but are not limited to, high-κ materials such as $HfO_2$ and $La_2O_3$. According to an exemplary embodiment, a combination of gate metals is used in the replacement gate. For instance, a workfunction setting metal layer is deposited onto the gate dielectric, followed by a filler metal layer. Suitable workfunction setting metals include, but are not limited to, n-type workfunction setting metals such as TiN and TaN, and p-type workfunction setting metals such as W. Suitable filler metals include, but are not limited to, Al.

Figure 16:
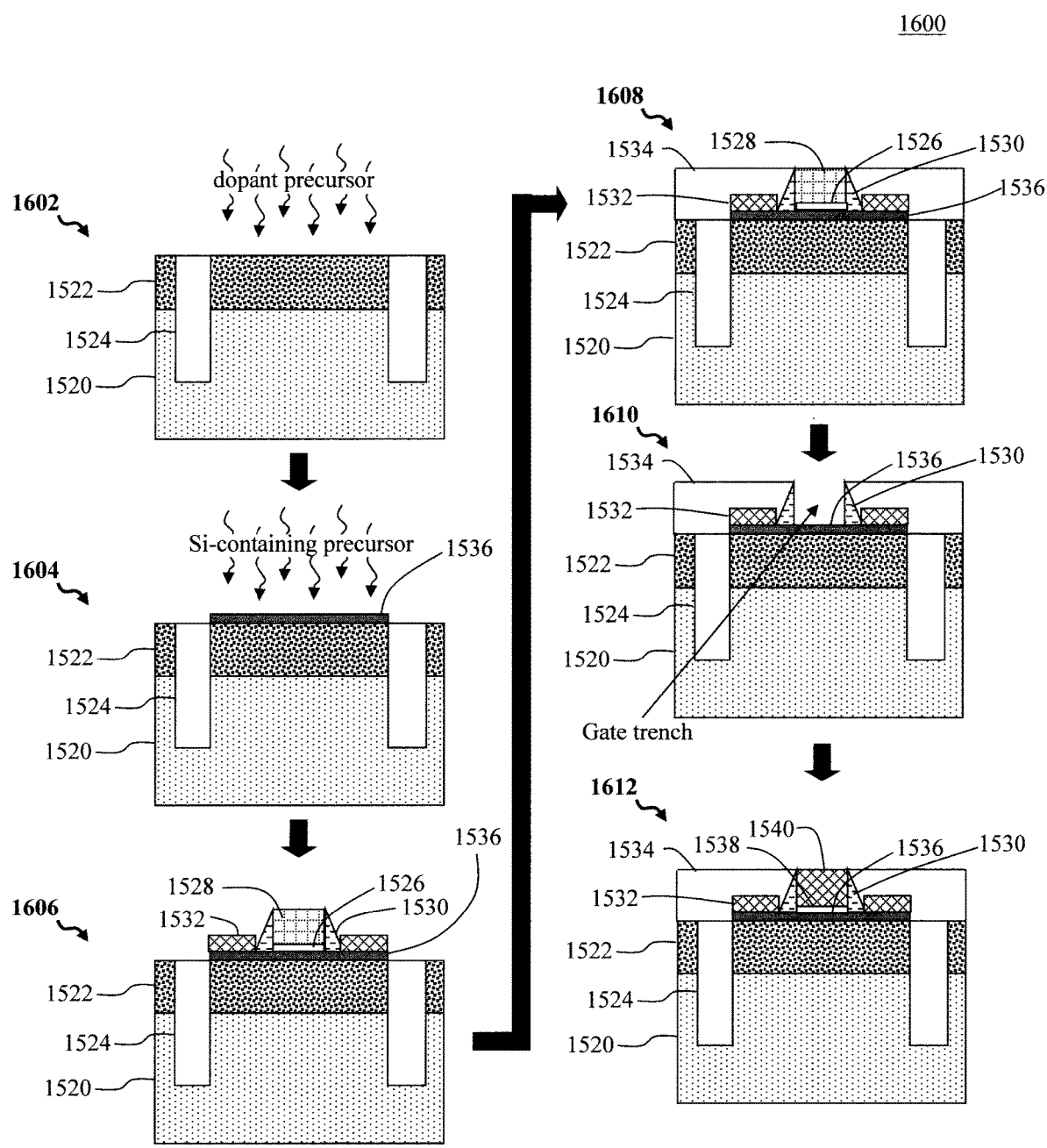
FIG. 16 is a diagram illustrating an alternative exemplary methodology for forming a planar FET device according to an embodiment of the present invention.

Optionally, the dopant/Si-containing chemical precursor exposures may be performed earlier on in the process, such as prior to placement of the dummy gate. See, for example, methodology 1600 of FIG. 16. The details of the process flow illustrated in FIG. 16 are the same as methodology 1500 of FIG. 15 described above, except that the exposure(s) are performed at a different stage. Thus, like structures are numbered alike in the description that follows.

In the same manner as described above, in step 1602 an epitaxial SiGe channel material 1522 is grown on a substrate 1520, and STI regions 1524 are formed to define an active area of the device. In contrast to methodology 1500, here the dopant/Si precursor exposures are performed at the beginning of the process. Namely, the SiGe channel material 1522 is next optionally exposed to an n-dopant precursor containing, e.g., P, As, and/or Bi, in a solid, liquid or gaseous form. For instance, as described in accordance with the description of step 106 of methodology 100 above, the SiGe channel material 1522 is contacted with the dopant precursor under conditions sufficient to chemically dope the surface of the SiGe channel material 1522 with the n-type dopant. Suitable conditions, i.e., temperature, pressure, and duration, were provided above. As also described above, the n-dopant precursor can be diluted, e.g., with a non-reactive carrier gas such as $H_2$, in order to achieve a desired n-dopant surface concentration on the SiGe channel material 1522.

In step 1604, the SiGe channel material 1522 is then exposed to an Si-containing chemical precursor, e.g., Si—H molecules with or without Cl, such as $SiH_4$, $Si_2H_6$, $Si_2H_2Cl_2$ (DCS), in a solid, liquid or gaseous form. For instance, as described in accordance with the description of step 108 of methodology 100 above, the SiGe channel material 1522 is contacted with the Si-containing chemical precursor under conditions sufficient to form a thin continuous Si layer 1536 on the SiGe channel material 1522. Suitable conditions, i.e., temperature, pressure, and duration, were provided above.

Once the exposures have been performed, the balance of the process remains the same, from placement of the dummy gate oxide 1526/dummy gate 1528 and spacers 1530 (see step 1606) to depositing a dielectric material 1534 around the dummy gate 1528 (see step 1608), removal of the dummy gate 1528 selective to the dielectric material 1534 forming a gate trench in the dielectric material 1534 (see step 1610) and replacing the dummy gate 1528 with a replacement gate 1540, e.g., a RMG stack (see step 1612). As shown in step 1612, the replacement gate stack includes a gate dielectric 1538 over the thin continuous Si layer 1536. The presence of the thin continuous Si layer 1536 on the SiGe channel material 1522 passivates the SiGe/gate dielectric interface and significantly reduces the Dit.

Figure 17:
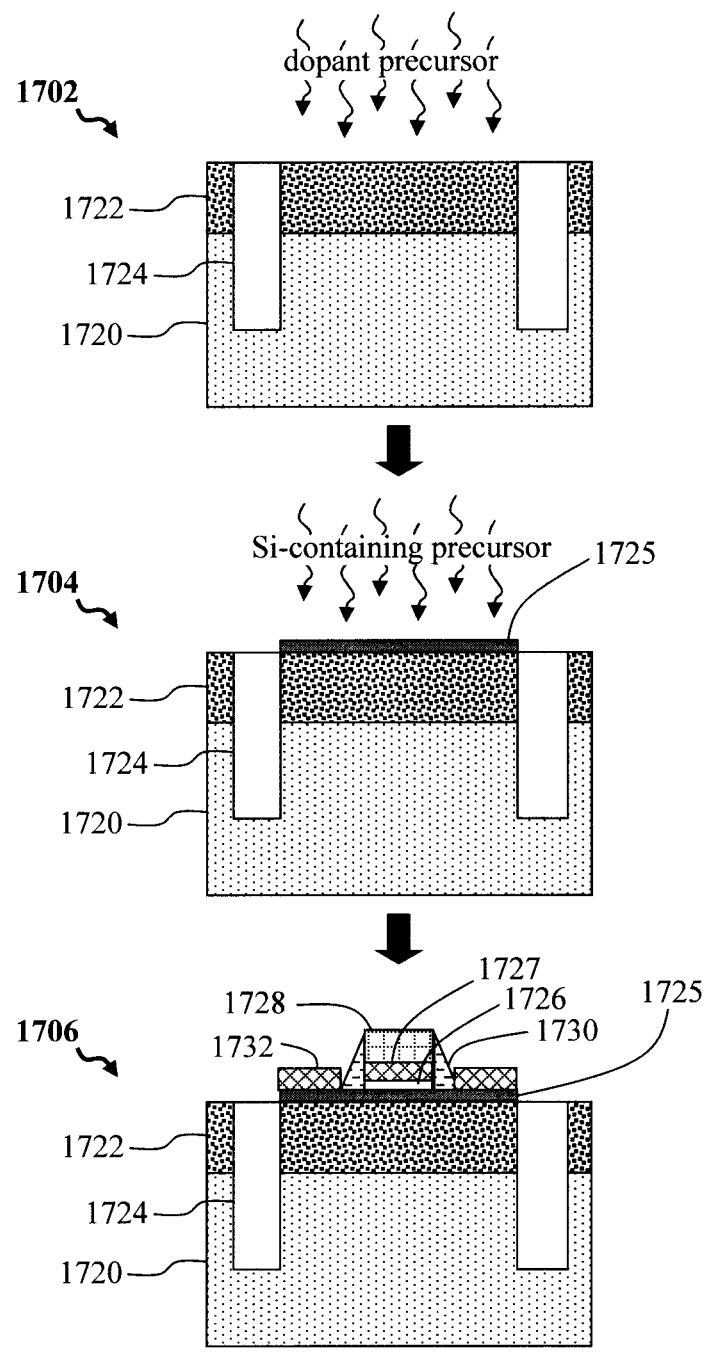
FIG. 17 is a diagram illustrating an exemplary gate-first methodology for forming a planar FET device according to an embodiment of the present invention.

The implementation of a gate-last approach in the above process flows is merely one non-limiting example, and embodiments are anticipated herein where a gate-first approach is used instead. By way of example only, an exemplary process flow implementing the present techniques along with a gate-first approach is illustrated in methodology 1700 of FIG. 17.

In step 1702, an epitaxial SiGe channel material 1722 is grown on a substrate 1720, and STI regions 1724 are formed to define an active area of the device. The SiGe channel material 1722 is then optionally exposed to an n-dopant precursor containing, e.g., P, As, and/or Bi, in a solid, liquid or gaseous form. For instance, as described in accordance with the description of step 106 of methodology 100 above, the SiGe channel material 1722 is contacted with the dopant precursor under conditions sufficient to chemically dope the surface of the SiGe channel material 1722 with the n-type dopant. Suitable conditions, i.e., temperature, pressure, and duration, were provided above. As also described above, the n-dopant precursor can be diluted, e.g., with a non-reactive carrier gas such as $H_2$, in order to achieve a desired n-dopant surface concentration on the SiGe channel material 1722.

In step 1704, the SiGe channel material 1722 is then exposed to an Si-containing chemical precursor, e.g., Si—H molecules with or without Cl, such as $SiH_4$, $Si_2H_6$, $Si_2H_2Cl_2$ (DCS), in a solid, liquid or gaseous form. For instance, as described in accordance with the description of step 108 of methodology 100 above, the SiGe channel material 1722 is contacted with the Si-containing chemical precursor under conditions sufficient to form a thin continuous Si layer 1725 on the SiGe channel material 1722. Suitable conditions, i.e., temperature, pressure, and duration, were provided above.

Once the exposures have been performed, a gate stack is then formed on the SiGe channel material 1722 over a channel region of the device. See step 1706. According to an exemplary embodiment, the gate stack includes a gate dielectric 1726 (over the thin continuous Si layer 1725), a metal layer 1727 disposed on the gate dielectric 1726, and a doped poly-Si layer 1728 disposed on the metal layer 1727. According to an exemplary embodiment, the gate dielectric 1726 is a high-κ material. Suitable high-κ gate dielectrics include, but are not limited to, $HfO_2$ and $La_2O_3$. According to an exemplary embodiment, the metal layer 1727 includes a combination of metals. For instance, a workfunction setting metal layer is deposited onto the gate dielectric 1726, followed by a filler metal layer. Suitable workfunction setting metals include, but are not limited to, n-type workfunction setting metals such as TiN and TaN, and p-type workfunction setting metals such as W. Suitable filler metals include, but are not limited to, Al.

As shown in step 1706, spacers 1730 and source and drain regions 1732 are formed on opposite sides of the gate stack. The spacers 1730 offset the gate stack from the source and drain regions 1732.

Generally, the present techniques can be implemented in any device process flow with a SiGe channel to reduce the Dit at the SiGe/gate dielectric interface. Some additional examples include, but are not limited to, nanosheet/nanowire-based devices. The term "nanosheet," as used herein, refers to a sheet or a layer having nanoscale dimensions. Further, the term "nanosheet" may also be used interchangeably herein with the term "nanowire" when referring to a particular structure. For instance, "nanosheet" can be used to refer to a "nanowire" with a larger width, and/or "nanowire" may be used to refer to a "nanosheet" with a smaller width, and vice versa. The general process for forming a nanosheet/nanowire FET device is described in detail in U.S. Patent Application Publication Number 2017/0117359 A1 by Cheng et al., entitled "Bulk Nanosheet with Dielectric Isolation," the contents of which are incorporated by reference as if fully set forth herein.

Figure 18:
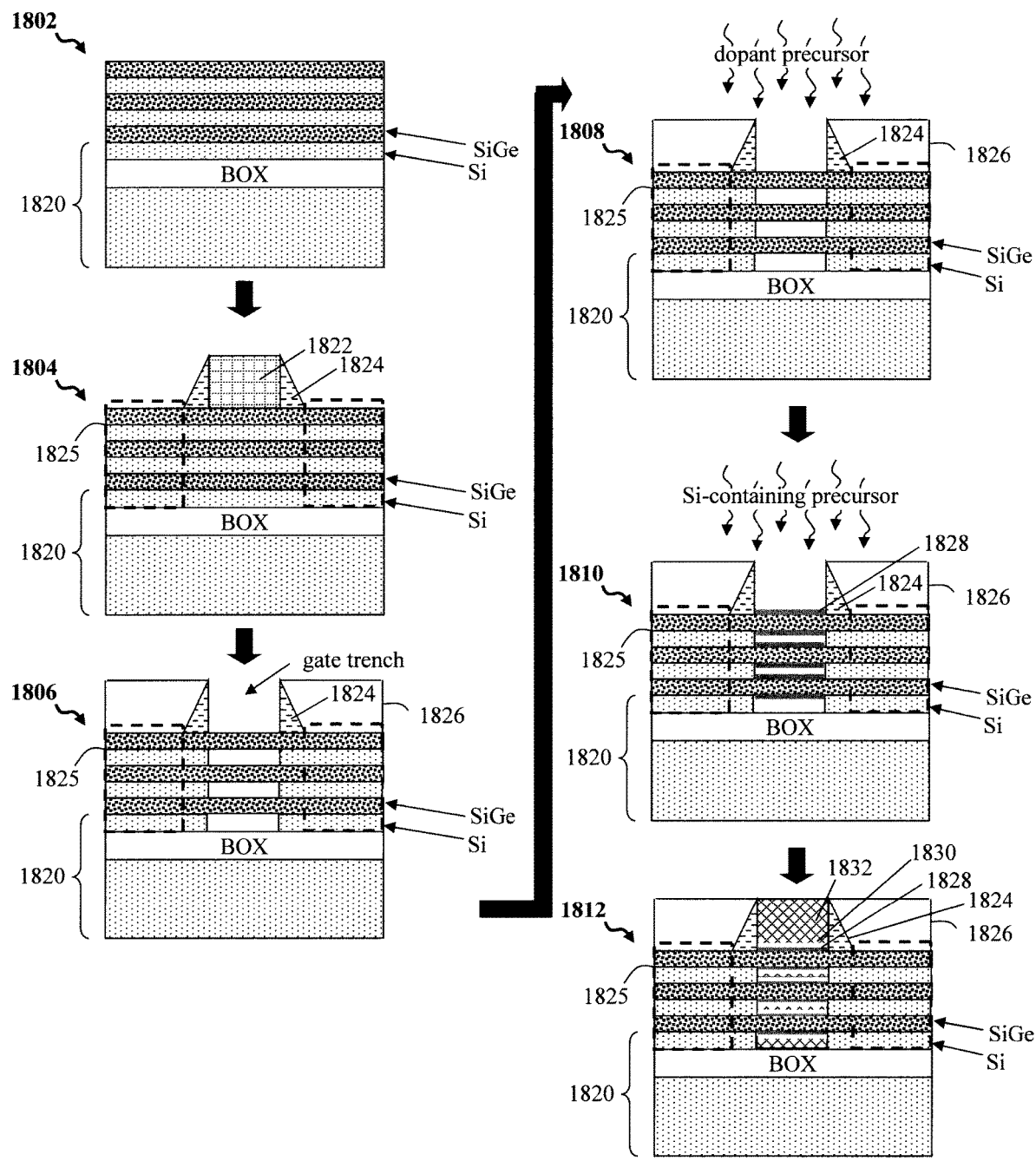
FIG. 18 is a diagram illustrating an exemplary methodology for forming a nanosheet/nanowire FET device according to an embodiment of the present invention.

For example, according to methodology 1800 of FIG. 18, in step 1802 an alternating stack of Si and SiGe layers are epitaxially grown on a wafer 1820. In this example, the wafer 1820 is an SOI wafer, wherein the SOI layer is a first Si layer in the stack. In this configuration, either the Si or SiGe layers in the stack can be sacrificial layers, and the SiGe or Si layers in the stack can be the channel material. Namely, later on in the process the sacrificial layers will be removed from the stack (selective to the channel material) in the channel region of the device, permitting the replacement gate to surround a portion of each of the channel material layers. In one exemplary configuration, in order to leverage the benefits of SiGe as a channel material of the device, the Si layers will serve as the sacrificial layers in the stack. However, it is notable that in practice either the Si or SiGe layers in the stack can serve as the sacrificial or channel material to the other. The Si/SiGe layers in the stack can be configured as nanosheets/nanowires each having a thickness, e.g., of from about 10 nm to about 25 nm, and ranges therebetween.

In step 1804, a dummy gate 1822 is formed over a portion of the stack in the channel region of the device, and spacers 1824 are formed on opposite sides of the dummy gate 1822. As provided above, suitable dummy gate materials include, but are not limited to, amorphous-Si, poly-Si, etc. Source and drain regions 1825 are formed (e.g., from an in-situ or ex-situ doped epitaxial material such as epitaxial Si or SiGe) on portions of the stack extending out from the dummy gate 1822.

In step 1806, a dielectric material 1826 is deposited around the dummy gate 1822, and the dummy gate 1822 is removed selective to the dielectric material 1826 forming a gate trench in the dielectric material 1826 in the channel region of the device. The sacrificial layers are then removed selective to the channel material layers from the stack within the gate trench thereby suspending the (in this particular example SiGe) channel material layers in the channel region of the device. The sacrificial layers can be removed using a Si or SiGe selective etch.

In step 1808, an optional exposure of the SiGe channel material layers to an n-dopant precursor containing, e.g., P, As, and/or Bi, in a solid, liquid or gaseous form can be performed. For instance, as described in accordance with the description of step 106 of methodology 100 above, the SiGe channel material layers are contacted with the dopant precursor under conditions sufficient to chemically dope the surface of the SiGe channel material with the n-type dopant. Suitable conditions, i.e., temperature, pressure, and duration, were provided above. As also described above, the n-dopant precursor can be diluted, e.g., with a non-reactive carrier gas such as $H_2$, in order to achieve a desired n-dopant surface concentration on the SiGe channel material layers.

In step 1810, the SiGe channel material layers are then exposed to a Si-containing chemical precursor, e.g., Si—H molecules with or without Cl, such as $SiH_4$, $Si_2H_6$, $Si_2H_2Cl_2$ (DCS), in a solid, liquid or gaseous form. For instance, as described in accordance with the description of step 108 of methodology 100 above, the SiGe channel material layers are contacted with the Si-containing chemical precursor under conditions sufficient to form a thin continuous Si layer 1828 on the SiGe channel material layers. Suitable conditions, i.e., temperature, pressure, and duration, were provided above.

Next, in step 1812, a replacement gate stack is formed in the gate trench at least partially surrounding a portion of each of the SiGe channel material layers (which are now chemically doped with the n-type dopant and coated with the thin continuous Si layer 1828). According to an exemplary embodiment, the replacement gate stack is a metal gate, and the instant process is a RMG process. The replacement gate stack includes a gate dielectric 1830 on the SiGe channel material layers over the thin continuous Si layer 1828, and a metal or combination of metals 1832 on the gate dielectric 1830. The presence of the thin continuous Si layer 1828 on the SiGe channel material layers passivates the SiGe/gate dielectric interface and significantly reduces the Dit. Suitable gate dielectrics for a metal gate include, but are not limited to, high-κ materials such as $HfO_2$ and $La_2O_3$. According to an exemplary embodiment, a combination of gate metals is used in the replacement gate. For instance, a workfunction setting metal layer is deposited onto the gate dielectric 1830, followed by a filler metal layer. Suitable workfunction setting metals include, but are not limited to, n-type workfunction setting metals such as TiN and TaN, and p-type workfunction setting metals such as W. Suitable filler metals include, but are not limited to, Al.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A field effect transistor (FET) device, comprising:
   a substrate;
   an epitaxial silicon germanium (SiGe) channel material disposed on the substrate;
   a thin continuous silicon (Si) layer formed on a surface of the SiGe channel material, wherein the thin continuous Si layer is less than 5 monolayers thick, wherein the SiGe channel material comprises planar surfaces and faceted surfaces, wherein the Si layer has a thickness T1 over the planar surfaces and a thickness T2 over the faceted surfaces, and wherein T1>T2; and
   a gate stack disposed on the SiGe channel material, wherein the gate stack comprises a gate dielectric disposed on the SiGe channel material over the thin continuous Si layer and a gate conductor on the gate dielectric, and wherein the thin continuous Si layer passivates an interface between the SiGe channel material and the gate dielectric.

2. The FET device of claim 1, wherein a surface of the SiGe channel material comprises a chemically doped n-type dopant selected from the group consisting of: phosphorous, arsenic, bismuth, and combinations thereof.

3. The FET device of claim 1, wherein the SiGe channel material and the substrate are patterned into at least one fin.

4. The FET device of claim 3, wherein each fin has a top portion comprising the SiGe material and a bottom portion comprising the substrate.

5. The FET device of claim 4, further comprising:
   a shallow trench isolation (STI) oxide disposed around the bottom portion of each fin.

6. The FET device of claim 1, wherein the SiGe channel material contains from about 15% to about 40% germanium (Ge) and ranges therebetween.

7. The FET device of claim 1, wherein the SiGe channel material contains from about 15% to about 25% Ge and ranges therebetween.

8. The FET device of claim 1, wherein the substrate comprises a crystalline semiconductor material.

9. The FET device of claim 8, wherein the crystalline semiconductor material is selected from the group consisting of: crystalline Si, crystalline SiGe, a crystalline III-V material, a crystalline II-VI material, and combinations thereof.

10. The FET device of claim 1, wherein the substrate comprises exposed crystallographic surface orientations on which the SiGe channel material is disposed.

11. A FET device, comprising:
    a substrate;
    an epitaxial SiGe channel material disposed on the substrate, wherein the SiGe channel material and the substrate are patterned into at least one fin, and wherein each fin has a top portion comprising the SiGe material and a bottom portion comprising the substrate;
    a thin continuous Si layer formed on a surface of the SiGe channel material, wherein the thin continuous Si layer is less than 5 monolayers thick, wherein the SiGe channel material comprises planar surfaces and faceted surfaces, wherein the Si layer has a thickness T1 over the planar surfaces and a thickness T2 over the faceted surfaces, and wherein T1>T2; and
    a gate stack disposed on the SiGe channel material, wherein the gate stack comprises a gate dielectric disposed on the SiGe channel material over the thin continuous Si layer and a gate conductor on the gate dielectric, and wherein the thin continuous Si layer passivates an interface between the SiGe channel material and the gate dielectric.

12. The FET device of claim 11, wherein a surface of the SiGe channel material comprises a chemically doped n-type dopant selected from the group consisting of: phosphorous, arsenic, bismuth, and combinations thereof.

13. The FET device of claim 11, further comprising:
    an STI oxide disposed around the bottom portion of each fin.

14. The FET device of claim 11, wherein the SiGe channel material contains from about 15% to about 40% Ge and ranges therebetween.

15. The FET device of claim 11, wherein the substrate comprises a crystalline semiconductor material.

16. The FET device of claim 15, wherein the crystalline semiconductor material is selected from the group consisting of: crystalline Si, crystalline SiGe, a crystalline III-V material, a crystalline II-VI material, and combinations thereof.

* * * * *